(12) United States Patent
Kawata et al.

(10) Patent No.: US 6,284,818 B1
(45) Date of Patent: Sep. 4, 2001

(54) ENCAPSULANT COMPOSITION AND ELECTRONIC DEVICE

(75) Inventors: Tatsuo Kawata; Hiroyuki Sakai; Terumi Tsukahara, all of Ibaraki-ken (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 09/521,212

(22) Filed: Mar. 8, 2000

(30) Foreign Application Priority Data

| Mar. 9, 1999 | (JP) | 11-061514 |
| Jan. 26, 2000 | (JP) | 12-021785 |
| Feb. 8, 2000 | (JP) | 12-030636 |

(51) Int. Cl.$^7$ .................................................. C08K 5/36
(52) U.S. Cl. ........................................... 523/451; 523/460
(58) Field of Search .................................... 523/451, 460

(56) References Cited

U.S. PATENT DOCUMENTS

| 6,194,491 | * | 2/2001 | Fujii | 523/466 |
| 6,211,277 | * | 4/2001 | Kawata | 524/492 |

* cited by examiner

*Primary Examiner*—Paul R. Michl
(74) *Attorney, Agent, or Firm*—Antonelli, Terry, Stout & Kraus, LLP

(57) ABSTRACT

In the present invention, provided are i) an encapsulant composition comprising an epoxy resin, a curing agent, an inorganic filler, an adduct of triphenylphosphine with benzoquinone, and a hydrous bismuth nitrate oxide; the inorganic filler being mixed in an amount of from 70% by volume to 85% by volume based on the total weight of the encapsulant composition, and the hydrous bismuth nitrate oxide being mixed in an amount of from 2.5 parts by weight to 20 parts by weight based on 100 parts by weight of the epoxy resin, and ii) an electronic device having an encapsulating member comprising a cured product of this encapsulant composition.

6 Claims, 1 Drawing Sheet

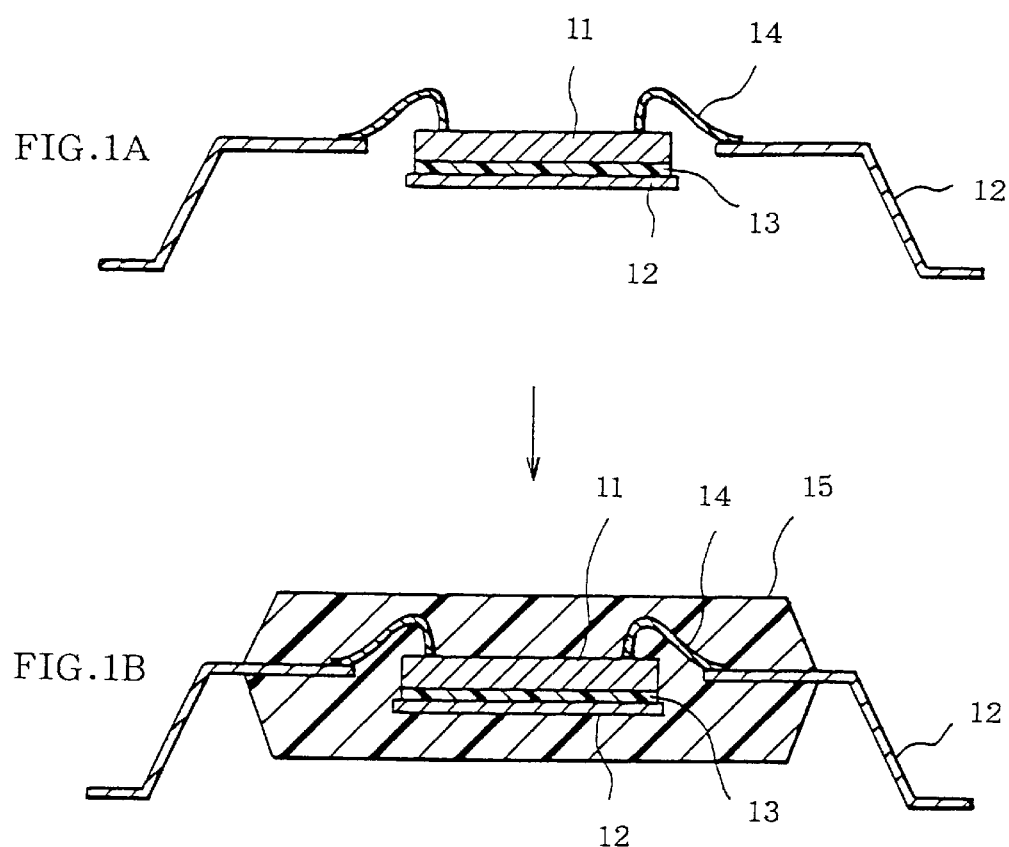

ENCAPSULANT COMPOSITION AND ELECTRONIC DEVICE

This application is based on Japanese Patent Applications No. Hei 11-061514, No. 2000-021785 and No. 2000-030636 filed in Japan, the contents of which are incorporated hereinto by reference.

BACKGROUND OF THE INVENTION

1. Field of the Invention

This invention relates to an encapsulant composition having a superior moisture resistance and also having good continuous operability and reflow resistance, and an electronic device having device components encapsulated with this composition.

2. Description of the Related Art

In recent years, with an improvement in integration of semiconductor device components such as ICs (integrated circuits) and LSIs (large-scale integrated circuits), device components are being made larger in scale and semiconductor devices are being made smaller and thinner. In thin-type semiconductor devices, however, the occurrence of blistering or cracking in their production steps has come into question. This is because, when semiconductor devices are mounted to a substrate, they are exposed to a high temperature of 200° C. or above in a short time as a result of their immersion in a soldering bath, so that the moisture contained in an encapsulant vaporizes and the vapor pressure thereby produced acts as a peel stress at the interface between the encapsulant and a insert such as the device component or a lead frame to cause separation of the encapsulant from the insert at their interface.

As measures for preventing the blistering or cracking caused by such separation, used are a method in which a coat material is used on the device surface or the back of islands of a lead frame so as to improve its adhesion to the encapsulant, a method in which dimples or slits are formed on the back of islands of a lead frame, and a method in which an LOC (lead on chip) structure is employed so as to improve the adhesion to the encapsulant. These methods, however, have the problems that a high cost may result or no satisfactory effect can be attained. Accordingly, it is sought to improve the encapsulant itself.

Under such circumstances, as a measure for improving the adhesion between the encapsulant and the insert, the manner of addition of and treatment with various coupling agents has been studied on, e.g., making epoxy resins and curing agents have lower viscosity (lower molecular weight), using epoxysilane and mercaptosilane in combination, and using ureidosilane and mercaptosilane in combination. These conventional methods, however, can not be said that they provide sufficient adhesion between the encapsulant and the insert. Moisture may enter from slightly separated portions to cause the problem of a low moisture resistance.

SUMMARY OF THE INVENTION

The present invention was made taking account of such existing circumstances. Thus, an object of the present invention is to provide an encapsulant composition having a superior moisture resistance and also having good continuous operability and reflow resistance, and an electronic device making use of such a composition.

As a result of extensive studies made in order to solve the above problem, the present inventors have discovered that the above object can be achieved by mixing in an encapsulant composition an adduct of triphenylphosphine with benzoquinone, a specific amount of hydrous bismuth nitrate oxide and a specific amount of an inorganic filler. Thus, they have accomplished the present invention.

The present invention provides an encapsulant composition comprising as essential constituents an epoxy resin, a curing agent, an inorganic filler, an adduct of triphenylphosphine with benzoquinone, and a hydrous bismuth nitrate oxide; the inorganic filler being mixed in an amount of from 70% by volume to 85% by volume based on the volume of the encapsulant composition, and the hydrous bismuth nitrate oxide being mixed in an amount of from 2.5 parts by weight to 20 parts by weight based on 100 parts by weight of the epoxy resin. It also provides an electronic device having an encapsulating member comprising a cured product of this encapsulant composition. In the encapsulant composition of the present invention, at least 50% by weight of the inorganic filler may preferably comprise spherical particles. Also, the epoxy resin may preferably comprise a biphenyl type epoxy resin, and the curing agent may preferably comprise an aralkyl type phenolic resin.

BRIEF DESCRIPTION OF THE DRAWINGS

FIGS. 1A and 1B are cross-sectional illustrations of an example of a process of fabrication of a resin-encapsulated semiconductor device.

DETAILED DESCRIPTION OF THE INVENTION

1. Constituents

The encapsulant composition of the present invention comprises an epoxy resin, a curing agent, an inorganic filler, an adduct of triphenylphosphine with benzoquinone, and hydrous bismuth nitrate oxide. The respective constituents will be described below.

(1) Epoxy Resin

In the present invention, there are no particular limitations on the constituent usable as an epoxy resin. Those commonly used in encapsulant compositions may appropriately be selected. Epoxy resins usable in the encapsulant composition of the present invention may include, e.g.;

- epoxidized products of novolak resin such as phenol novolak type epoxy resin and orthocresol novolak type epoxy resin, obtained by the condensation or co-condensation of phenols, such as phenol, cresol, xylenol, resorcinol, catechol, bisphenol A and bisphenol F, and/or naphthols, such as α-naphthol, β-naphthol and dihydroxynaphthalene, with compounds having an aldehyde group, such as formaldehyde, acetaldehyde, propionaldehyde, benzaldehyde and salicylaldehyde, in the presence of an acid catalyst;
- diglycidyl ether type epoxy resins such as diglycidyl ethers of bisphenol A, bisphenol F, bisphenol S, or an alkyl-substituted or unsubstituted bisphenol;
- stilbene type epoxy resins;
- hydroquinone type epoxy resins;
- glycidyl ester type epoxy resins obtained by the reaction of polybasic acids such as phtalic acid and dimer acid with epichlorohydrin;
- glycidylamine type epoxy resins obtained by the reaction of polyamines, such as diaminodiphenylmethane and isocyanuric acid, with epichlorohydrin;
- epoxidized products of co-condensation resins of dicyclopentadiene with phenols and/or naphthols;
- epoxy resins having a naphthalene ring;
- epoxidized products of aralkyl type phenolic resins, such as phenol-aralkyl resins and naphthol-aralkyl resins;
- trimethylolpropane type epoxy resins;
- terpene-modified epoxy resins; and linear aliphatic epoxy resins and alicyclic epoxy resins, obtained by the oxidation of olefinic bonds with peracids such as peracetic acid. Any of these may be used alone or in combination of two or more types.

In particular, from the viewpoint of the adhesion to inserts, biphenyl type epoxy resins which are diglycidyl ethers of alkyl-substituted or unsubstituted biphenol are preferred, and biphenyl type epoxy resins represented by the following Formula (I) is more preferred:

terpene type phenolic resins. Any of these may be used alone or in combination of two or more types.

In particular, from the viewpoint of the adhesion to inserts, aralkyl type phenolic resins are preferred, and phenol-aralkyl resins represented by the following Formula (II) are more preferred. Phenol-aralkyl resins represented by the following Formula (II) wherein R is a hydrogen atom and n is 0 to 8 on the average are particularly preferred in the present invention. As examples of such resins, they may include p-xylylene type Xylok and m-xylylene type Xylok.

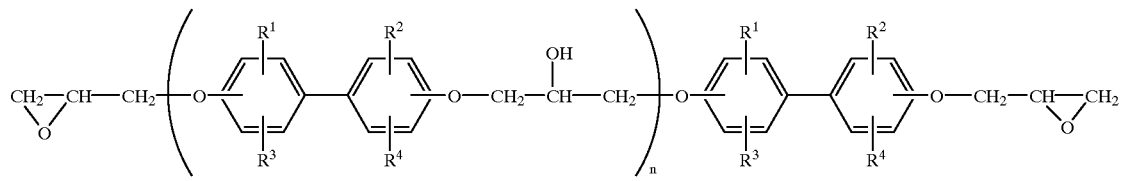

(I)

wherein $R^1$ to $R^4$ are each selected from a hydrogen atom and a substituted or unsubstituted monovalent hydrocarbon group having 1 to 10 carbon atoms, and may all be the same or different; and n represents an integer of 0 to 3.

The biphenyl type epoxy resins represented by Formula (I) may include, e.g., epoxy resins composed chiefly of 4,4'-bis(2,3-epoxypropoxy)biphenyl or 4,4'-bis(2,3-epoxypropoxy)-3,3', 5,5'-tetramethylbiphenyl, and epoxy resins obtained by the reaction of 4,4'-biphenol or 4,4'-(3,3',5,5'-tetramethyl)biphenol with epichlorohydrin. In particular, epoxy resins composed chiefly of 4,4'-bis(2,3-epoxypropoxy)-3,3',5,5'-tetramethylbiphenyl are preferred.

In the case when the biphenyl type epoxy resin is used, in order for its performance to be exhibited, it may preferably be mixed in an amount of at least 30% by weight, more preferably at least 50% by weight, and still more preferably at least 60% by weight, based on the total weight of the epoxy resin.

(2) Curing Agent

In the present invention, there are no particular limitations on the constituent usable as a curing agent. Those commonly used in encapsulant compositions may appropriately be selected. Curing agents usable in the encapsulant composition of the present invention may include, e.g., curing agents of phenolic resin types such as:

novolak type phenolic resins obtained by the condensation or co-condensation of phenols, such as phenol, cresol, resorcinol, catechol, bisphenol A, bisphenol F, phenylphenol and aminophenol, and/or naphthols such as α-naphthol, β-naphthol and dihydroxynaphthalene, with compounds having an aldehyde group such as formaldehyde in the presence of an acid catalyst;

aralkyl type phenolic resins, such as phenol-aralkyl resins and naphthol-aralkyl resins, synthesized from phenols and/or naphthols and dimethoxyparaxylene or bis(methoxymethyl)biphenyl; and

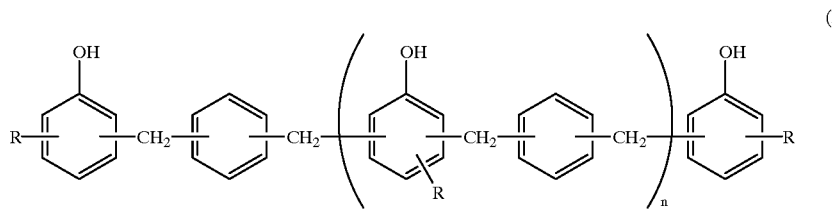

(II)

wherein R's are each selected from a hydrogen atom and a substituted or unsubstituted monovalent hydrocarbon group having 1 to 10 carbon atoms, and n represents an integer of 0 to 10.

In the case when the aralkyl type phenolic resin is used, in order for its performance to be exhibited, it may preferably be mixed in an amount of at least 30% by weight, more preferably at least 50% by weight, and still more preferably at least 60% by weight, based on the total weight of the curing agent.

The amount of the curing agent to be mixed is determined from the ratio of (the number of epoxy groups in the epoxy resin)/(the number of hydroxyl groups in the curing agent). In order to keep any unreacted matter of each constituent in a small quantity, the ratio may preferably be set within the range of from 0.5 to 2, and more preferably from 0.7 to 1.3. In order to obtain a molding material having good molding properties and reflow resistance, it may still more preferably be set within the range of from 0.8 to 1.2.

(3) Inorganic Filler

In the present invention, there are no particular limitations on the constituent usable as an inorganic filler. Those commonly used in encapsulant compositions may appropriately be selected. Inorganic fillers usable in the encapsulant composition of the present invention may include, e.g., powders of fused silica, crystalline silica, alumina, calcium silicate, calcium carbonate, potassium titanate, silicon carbide, silicon nitride, aluminum nitride, boron nitride, beryllia, zirconia, zircon, forsterite, steatite, spinel, mullite and titania, or beads of any of these made spherical, and glass fibers. Of these, fused silica is preferred from the viewpoint of reducing the coefficient of linear expansion, and alumina from the viewpoint of high thermal conductivity. Inorganic fillers having a flame-retardant effect may also be used, as exemplified by aluminum hydroxide, magnesium hydroxide, zinc borate and zinc molybdate. Any of these inorganic fillers may be used alone or in combination of two or more types.

The inorganic filler must be mixed in an amount of from 70 to 85% by volume based on the volume of the encapsulant composition. If it is mixed in an amount less than 70% by volume, the composition may have a high moisture absorption and may have a poor reflow resistance. If it is in an amount more than 85% by volume, the composition may have a low fluidity, making its molding difficult.

From the viewpoint of fluidity, the inorganic filler may preferably have a spherical particle shape, and at least 50% by weight of the inorganic filler may preferably icomprise spherical particles.

(4) Curing Accelerator

In the present invention, the adduct of triphenylphosphine with benzoquinone is used as a curing accelerator. This curing accelerator is mixed in the encapsulant composition of the present invention from the viewpoint of continuous operability. As the adduct of triphenylphosphine with benzoquinone, an adduct of triphenylphosphine with 1,4-benzoquinone is preferred.

In the encapsulant composition of the present invention, in addition to the adduct of triphenylphosphine with benzoquinone, an additional curing accelerator may further be used in combination as long as the effect of the present invention is achievable. There are no particular limitations on the curing accelerator usable in combination, and those commonly used in encapsulant compositions may appropriately be selected. The curing accelerator usable in combination may include, e.g.;

cycloamidine compounds such as 1,8-diazabicyclo[5.4.0]undecene-7, 1,5-diazabicyclo[4.3.0]nonene and 5,6-dibutylamino-1,8-diazabicyclo[5.4.0]undecene-7;

salts such as a phenolic salt, a phenolic resin salt, 2-ethylhexane salt, an oleate, a p-toluenesulfonate and a formate, of these cycloamidine compounds;

compounds having intramolecular polarization, comprising any of these cycloamidine compounds to which a compound having a π-bond such as maleic anhydride, quinone compounds, e.g., 1,4-benzoquinone, 2,5-toluquinone, 1,4-naphthoquinone, 2,3-dimethylbenzoquinone, 2,6-dimethylbenzoquinone, 2,3-dimethoxy-5-methyl-1,4-benzoquinone, 2,3-dimethoxy-1,4-benzoquinone and phenyl-1,4-benzoquinone, diazophenylmethane or phenolic resin has been added;

tertiary amines such as benzyldimethylamine, triethanolamine, dimethylaminoethanol and tris(dimethylaminomethyl)phenol, and derivatives thereof;

imidazoles such as 2-methylimidazole, 2-phenylimidazole and 2-phenyl-4-methylimidazole, and derivatives thereof;

phosphorus compounds including organophosphines such as tributylphosphine, methyldiphenylphosphine, triphenylphosphine, tris(4-methylphenyl)phosphine, diphenylphosphine and phenylphosphine; and compounds having intramolecular polarization, comprising any of these phosphines to which a compound having a π-bond such as maleic anhydride, the above quinone compound, diazophenylmethane or phenolic resin has been added, but exclusive of the adduct of triphenylphosphine with benzoquinone; and tetraphenylborates such as tetraphenylphosphonium tetraphenylborate, triphenylphosphine tetraphenylborate, 2-ethyl-4-methylimidazole tetraphenylborate and N-methylmorpholine tetraphenylborate, and derivatives thereof. In particular, phosphorus compounds are preferred. Any of these may be used alone or in combination of two or more types.

The curing accelerator comprising the adduct of triphenylphosphine with benzoquinone may be mixed in any amount without any particular limitations as long as it is an amount that can achieve curing acceleration effect, and may preferably be in an amount of from 0.005 to 2% by weight, and more preferably from 0.01 to 0.5% by weight, based on the weight of the encapsulant composition. If it is less than 0.005% by weight, the composition tends to have a poor short-time curability. If it is more than 2% by weight, its curing rate may be so high as to tend to make it difficult to obtain good molded products.

In the case when the curing accelerator other than the adduct of triphenylphosphine with benzoquinone is used in combination, the adduct of triphenylphosphine with benzoquinone may preferably be mixed, in order for its performance to be exhibited, in an amount of at least 30% by weight, more preferably at least 50% by weight, and still more preferably at least 60% by weight, based on the total weight of the curing accelerator.

(5) Ion Scavenger

In the present invention, the hydrous bismuth nitrate oxide is used as an ion scavenger. This hydrous bismuth nitrate oxide may include, e.g., as preferred ones "IXE-500" and "IXE-550" (both trade names), available from Toagosei Chemical Industry Co., Ltd.

The hydrous bismuth nitrate oxide is mixed in an amount of from 2.5 to 20 parts by weight based on 100 parts by weight of the epoxy resin. If it is mixed in an amount less than 2.5 parts by weight, the composition may have an insufficient ion scavenging effect. If it is more than 20 parts by weight, other properties may adversely be affected.

In the encapsulant composition of the present invention, in addition to the hydrous bismuth nitrate oxide, an additional ion scavenger may further be used in combination so far as the effect of the present invention can be achieved. There are no particular limitations on the ion scavenger usable in combination, and those commonly used in encapsulant compositions may appropriately be selected. The curing accelerator usable in combination may include, e.g., hydrotalcites, and hydrous oxides of elements selected from magnesium, aluminum, titanium, zirconium and bismuth. Any of these may be used alone or in combination of two or more types.

In the case when in addition to the hydrous bismuth nitrate oxide the additional ion scavenger is used in combination, the hydrous bismuth nitrate oxide may preferably be mixed, in order for its performance to be exhibited, in an amount of at least 30% by weight, more preferably at least 50% by weight, and still more preferably at least 60% by weight, based on the total weight of the ion scavenger.

(6) Additives

The encapsulant composition of the present invention may optionally contain various additives such as a coupling agent, a release agent, a colorant, a flame retardant and a stress relaxation agent. Any of these may be used alone or in combination of two or more types.

There are no particular limitations on the coupling agent usable in the encapsulant composition of the present invention, and those commonly used in encapsulant compositions may appropriately be selected. For example, usable are known compounds such as silane compounds, e.g., epoxysilane, alkylsilane, mercaptosilane, aminosilane, ureidosilane and vinylsilane, titanium oxides, aluminum chelates, and aluminum/zirconium compounds. Any of these may be used alone or in combination of two or more types. In particular, from the viewpoint of the adhesion to inserts, silane compounds are preferred, and epoxysilane is more preferred. Use of epoxysilane, alkyl silane and mercaptosilane in combination is still more preferred. The addition of such a coupling agent is preferable because it enables improvement of the adhesion between the resin component and the inorganic filler.

The release agent usable in the encapsulant composition of the present invention may include, e.g., higher fatty acids such as carnauba wax, and metal salts thereof, ester waxes, polyolefin waxes and polyethylene wax such as polyethylene and polyethylene oxide.

As the colorant, usable are, e.g., carbon black, organic dyes, organic pigments, titanium oxide, minium (or red lead oxide) and red iron oxide.

Also, the flame retardant may include, e.g., brominated epoxy resin, antimony trioxide, phosphate, red phosphorus, nitrogen-containing compounds such as melamine, melamine derivatives, compounds having a triazine ring, cyanuric acid derivatives and isocyanuric acid derivatives, phosphorus- and nitrogen-containing compounds such as cyclophosphazene, and metal compounds such as zinc oxide, iron oxide, molybdenum oxide and ferrocene.

As the stress relaxation agent, usable are, e.g., silicone oil and silicone rubber powder.

2. Production of Encapsulant Composition

The encapsulant composition of the present invention may be prepared by any methods as long as the respective constituent materials can uniformly be dispersed and mixed. As a commonly available method, a method may be used in which stated amounts of the constituent materials are thoroughly mixed by means of a mixer and thereafter melt-kneaded by means of mixing rolls and an extruder, followed by cooling and pulverization. The product obtained may be made into tablets in such a size and weight that may suit to molding conditions, so as to be usable with ease.

3. Electronic Device

The encapsulant composition of the present invention can improve the reflow resistance and moisture resistance of products, and hence is suitable to the encapsulation of device components in electronic devices. Accordingly, the present invention provides an electronic device encapsulated with the encapsulant composition of the present invention, i.e., an electronic device having an encapsulating member comprising a cured product of the encapsulant composition of the present invention.

The electronic device of the present invention may include electronic devices comprising a support member such as a lead frame, a wired tape carrier, a wiring board, a glass sheet or a silicon wafer, and a component or components, mounted thereon, including active components such as a semiconductor chip, a transistor, a diode and a thyristor and/or passive components such as a capacitor, a resistor and a coil the necessary part of which has been encapsulated with the encapsulant composition of the present invention.

Such electronic devices may include, e.g.:

resin-encapsulated ICs such as DIP (dual-inline package), PLCC (plastic-leaded chip carrier), QFP (quad flat package), SOP (small outline package), SOJ (small outline J-lead package), TSOP (thin small outline package) and TQFP (thin quad flat package) in which semiconductor components are fastened onto a lead frame, and terminals and leads such as bonding pads of each device component are connected by wire bonding or through bumps, followed by encapsulation with the encapsulant composition of the present invention by transfer molding or the like;

TCPs (tape carrier packages) in which semiconductor chips bonded to a tape carrier through bumps are encapsulated with the encapsulant composition of the present invention;

COB (chip-on-board) modules, hybrid ICs and multichip modules in which device components are bonded to wirings formed on a wiring board or glass sheet, by wire bonding, flip-chip bonding or soldering, and the device components thus bonded are encapsulated with the encapsulant composition of the present invention; and BGAs (ball grid arrays) and CSPs (chip size packages) in which device components are mounted on an organic substrate on the back of which terminals for wiring-board connection have been formed, and the device components are connected to wirings formed on the organic substrate, followed by encapsulation with the encapsulant composition of the present invention. The encapsulant composition of the present invention is also effectively usable to encapsulate electronic devices making use of printed circuit boards.

As methods for encapsulating electronic devices by the use of the encapsulant composition obtained in the present invention, low-pressure transfer molding is most commonly used. Injection molding or compression molding may also be used.

THE PREFERRED EMBODIMENT

The present invention will be described in greater detail by giving Examples. The present invention is by no means limited to these.

1. EXAMPLES 1 TO 6 & COMPARATIVE EXAMPLES 1 TO 7

Biphenyl type epoxy resin (trade name: EPIKOTE YX-4000H; available from Yuka Shell Epoxy K.K.) as the epoxy resin, bisphenol-A type brominated epoxy resin (epoxy equivalent weight: 375; softening point: 80° C.; bromine content: 48% by weight) as the flame retardant, aralkyl type phenolic resin (trade name: MILEX XL-225; available from Mitsui Chemicals Inc.) as the curing agent, an adduct of triphenylphosphine with 1,4-benzoquinone (C-1) or a phenol novolak salt of diazabicycloundecene (C-2) as the curing accelerator, hydrous bismuth nitrate oxide (trade name: IXE-500; available from Toagosei Chemical Industry Co., Ltd.) as the ion scavenger, spherical fused silica (average particle diameter: 17.5 $\mu$m) and angular fused silica (average particle diameter: 5.5 $\mu$m) as the inorganic filler, a mixture of epoxysilane, alkylsilane and mercaptosilane as the coupling agent, and, as other additives, carnauba wax (available from Cera Rica Noda Corporation, polyethylene wax, carbon black and antimony were mixed in parts by weight shown respectively in Table 1, and pre-blended (dry blending). The resultant blend was twin-roll kneaded under conditions of a kneading temperature of 80° C. and a kneading time of 10 minutes, followed by cooling and pulverization to prepare encapsulant resin products of Examples 1 to 6 and Comparative Example 1 to 7.

TABLE 1

Mixing Formulation 1 (part(s) by weight)

| Constituents mixed | Example | | | | | | Comparative Example | | | | | | |
|---|---|---|---|---|---|---|---|---|---|---|---|---|---|
| | 1 | 2 | 3 | 4 | 5 | 6 | 1 | 2 | 3 | 4 | 5 | 6 | 7 |
| Biphenyl type epoxy resin | 85.0 | 85.0 | 85.0 | 85.0 | 85.0 | 85.0 | 85.0 | 85.0 | 85.0 | 85.0 | 85.0 | 85.0 | 85.0 |
| Brominated epoxy resin | 15.0 | 15.0 | 15.0 | 15.0 | 15.0 | 15.0 | 15.0 | 15.0 | 15.0 | 15.0 | 15.0 | 15.0 | 15.0 |
| Aralkyl type phenolic resin | 84.4 | 84.4 | 84.4 | 84.4 | 84.4 | 84.4 | 84.4 | 84.4 | 84.4 | 84.4 | 84.4 | 84.4 | 84.4 |
| Curing accelerator C-1 | 3.7 | 3.7 | 3.7 | 3.7 | 3.7 | 3.7 | 3.7 | 3.7 | 3.7 | 3.7 | 3.7 | — | — |
| Curing accelerator C-2 | — | — | — | — | — | — | — | — | — | — | — | 9.0 | 9.0 |
| Hydrous bismuth nitrate oxide | 2.5 | 5.0 | 10.0 | 20.0 | 10.0 | 10.0 | — | 1.5 | 30.0 | 10.0 | 10.0 | 10.0 | — |
| Epoxysilane | 8.70 | 8.70 | 8.70 | 8.70 | 8.70 | 8.70 | 8.70 | 8.70 | 8.70 | 3.95 | 13.9 | 8.70 | 8.70 |
| Alkylsilane | 5.80 | 5.80 | 5.80 | 5.80 | 5.80 | 5.80 | 5.80 | 5.80 | 5.80 | 2.60 | 9.30 | 5.80 | 5.80 |
| Mercaptosilane | 0.10 | 0.10 | 0.10 | 0.10 | 0.10 | 0.10 | 0.10 | 0.10 | 0.10 | 0.05 | 0.15 | 0.10 | 0.10 |
| Polyethylene wax | 3.0 | 3.0 | 3.0 | 3.0 | 3.0 | 3.0 | 3.0 | 3.0 | 3.0 | 3.0 | 3.0 | 3.0 | 3.0 |
| Carnauba wax | 1.0 | 1.0 | 1.0 | 1.0 | 1.0 | 1.0 | 1.0 | 1.0 | 1.0 | 1.0 | 1.0 | 1.0 | 1.0 |
| Carbon black | 3.5 | 3.5 | 3.5 | 3.5 | 3.5 | 3.5 | 3.5 | 3.5 | 3.5 | 3.5 | 3.5 | 3.5 | 3.5 |
| Antimony trioxide | 6.0 | 6.0 | 6.0 | 6.0 | 6.0 | 6.0 | 6.0 | 6.0 | 6.0 | 6.0 | 6.0 | 6.0 | 6.0 |
| Angular fused silica | — | — | — | — | 672 | 1008 | — | — | — | — | — | — | — |
| Spherical fused silica | 1620 | 1640 | 1680 | 1760 | 1008 | 672 | 1600 | 1620 | 1820 | 760 | 2680 | 1650 | 1650 |
| Inorganic filler (% by volume) | 80 | 80 | 80 | 80 | 80 | 80 | 80 | 80 | 80 | 65 | 86 | 80 | 80 |

2. EXAMPLES 7 TO 12 & COMPARATIV EXAMPLES 8 TO 14

Biphenyl type epoxy resin (trade name: EPIKOTE YX-4000H; available from Yuka Shell Epoxy K.K.) as the epoxy resin, brominated epoxy resin (trade name: ESB-400T; available from Sumitomo Chemical Co., Ltd.) as the flame retardant, aralkyl type phenolic resin (trade name: MILEX XL-225; available from Mitsui Chemicals, Inc.) as the curing agent, an adduct of triphenylphosphine with 1,4-benzoquinone (C-1) or SA-841 (trade name; available from San-Apro Limited) as the curing accelerator, hydrous bismuth nitrate oxide (trade name: IXE-500; available from Toagosei Chemical Industry Co., Ltd.) as the ion scavenger, spherical fused silica (average particle diameter: 17.5 μm) and angular fused silica (average particle diameter: 5.5 μm) as the inorganic filler, epoxysilane (trade name: A-187; available from Nippon Unicar Co., Ltd.) as the coupling agent, and, as other additives, carnauba wax (available from Cera Rica Noda Corporatuion), polyethylene wax (trade name: PED-191; available from Clariant (Japan) K.K.), carbon black (trade name: MONARCH 800; available from Cabot Speciality Chemicals, Inc.) and antimony trioxide (trade name: RX; available from Sumitomo Metal Mining Co., Ltd.) were mixed in parts by weight shown respectively in Table 2, and pre-blended (dry blending). The resultant blend was twin-roll kneaded under conditions of a kneading temperature of 80° C. and a kneading time of 10 minutes, followed by cooling and pulverization to prepare encapsulant resin products of Examples 7 to 12 and Comparative Example 8 to 14.

TABLE 2

Mixing Formulation 2 (part(s) by weight)

| Constituents mixed | Example | | | | | | Comparative Example | | | | | | |
|---|---|---|---|---|---|---|---|---|---|---|---|---|---|
| | 7 | 8 | 9 | 10 | 11 | 12 | 8 | 9 | 10 | 11 | 12 | 13 | 14 |
| Biphenyl type epoxy resin | 85.0 | 85.0 | 85.0 | 85.0 | 85.0 | 85.0 | 85.0 | 85.0 | 85.0 | 85.0 | 85.0 | 85.0 | 85.0 |
| Brominated epoxy resin | 15.0 | 15.0 | 15.0 | 15.0 | 15.0 | 15.0 | 15.0 | 15.0 | 15.0 | 15.0 | 15.0 | 15.0 | 15.0 |
| Aralkyl type phenolic resin | 84.4 | 84.4 | 84.4 | 84.4 | 84.4 | 84.4 | 84.4 | 84.4 | 84.4 | 84.4 | 84.4 | 84.4 | 84.4 |
| Curing accelerator C-1 | 4.0 | 4.0 | 4.0 | 4.0 | 4.0 | 4.0 | 4.0 | 4.0 | 4.0 | 4.0 | 4.0 | — | — |
| Curing accelerator SA-841 | — | — | — | — | — | — | — | — | — | — | — | 9.0 | 9.0 |
| Hydrous bismuth nitrate oxide | 2.5 | 5.0 | 10.0 | 20.0 | 10.0 | 10.0 | — | 1.5 | 30.0 | 10.0 | 10.0 | 10.0 | — |
| Epoxysilane | 9.4 | 9.4 | 9.4 | 9.4 | 9.4 | 9.4 | 9.4 | 9.4 | 9.4 | 5.0 | 14.0 | 9.4 | 9.4 |
| Polyethylene wax | 1.0 | 1.0 | 1.0 | 1.0 | 1.0 | 1.0 | 1.0 | 1.0 | 1.0 | 1.0 | 1.0 | 1.0 | 1.0 |
| Carnauba wax | 1.0 | 1.0 | 1.0 | 1.0 | 1.0 | 1.0 | 1.0 | 1.0 | 1.0 | 1.0 | 1.0 | 1.0 | 1.0 |

TABLE 2-continued

Mixing Formulation 2 (part(s) by weight)

| Constituents mixed | Example | | | | | | Comparative Example | | | | | | |
|---|---|---|---|---|---|---|---|---|---|---|---|---|---|
| | 7 | 8 | 9 | 10 | 11 | 12 | 8 | 9 | 10 | 11 | 12 | 13 | 14 |
| Carbon black | 4.0 | 4.0 | 4.0 | 4.0 | 4.0 | 4.0 | 4.0 | 4.0 | 4.0 | 4.0 | 4.0 | 4.0 | 4.0 |
| Antimony trioxide | 6.0 | 6.0 | 6.0 | 6.0 | 6.0 | 6.0 | 6.0 | 6.0 | 6.0 | 6.0 | 6.0 | 6.0 | 6.0 |
| Angular fused silica | — | — | — | — | 625 | 940 | — | — | — | — | — | — | — |
| Spherical fused silica | 1560 | 1560 | 1560 | 1560 | 940 | 625 | 1560 | 1560 | 1560 | 710 | 2450 | 1600 | 1600 |
| Inorganic filler (% by volume) | 80 | 80 | 80 | 80 | 80 | 80 | 80 | 80 | 80 | 65 | 86 | 80 | 80 |

3. Evaluation

The encapsulant compositions obtained in the respective Examples and Comparative Examples were evaluated by test methods shown below. With regard to the properties of cured products, evaluation was made using molded products obtained by molding each encapsulant composition by transfer molding under conditions of a mold temperature of 180° C., a molding pressure of 6.9 MPa and a curing time of 90 seconds, followed by post-curing at 175° C. for 5 hours.

(1) Spiral Flow:

With regard to spiral flow, a mold prepared according to EMMI 1-66 was set in a transfer molding machine and the encapsulant composition was molded under the above conditions, where its flow distance (unit: cm) was determined to make evaluation.

(2) Hot Hardness:

To determine hot hardness, a burr measuring mold (a mold provided with slits of 5 mm wide and 50, 30, 20, 10, 5 and 2 μm deep) was set in a transfer molding machine, and the encapsulant composition was molded under the above conditions. Ten seconds after the opening of the mold, the hardness at the resin pools was measured with a Shore D-type hardness.

(3) Al-peel Strength:

To determine aluminum-peel strength, aluminum foil of 30 μm thick was laid in a mold with, and the encapsulant composition was molded into a test piece (127 mm long, 12.7 mm wide and 4.0 mm thick) under the above conditions. From the test piece, the aluminum foil of 12.7 mm wide was peeled in the direction of a right angle under conditions of a peel rate of 50 mm/minute, where the strength (unit: N/m) at peel was measured.

(4) Extract Fluid Characteristics of Cured Product:

Extract fluid characteristics in terms of chloride ion concentration of cured products were measured in the manner as described below. First, a disk mold was set in a transfer molding machine and the encapsulant composition was molded into a disk of 100 mm diameter and 2 mm thick under the above conditions. After its post curing, the cured product was finely pulverized. Next, 5 g of the molded product thus pulverized and 50 ml of distilled water were put in a decomposition vessel (trade name: Uniseal available from AMCO Incorporated) and hermetically closed after stirring. Subsequently, this Uniseal was put in a dryer kept at 121° C. to effect extraction for 20 hours, followed by cooling and then filtration. The extract fluid thus filtered was used as a sample, and chloride ion concentration (unit: ppm) was measured with an ion chromatographic analyzer.

(5) Moisture Absorption:

To determine moisture absorption, a disk mold was set in a transfer molding machine and the encapsulant composition was molded into a disk of 100 mm diameter and 3 mm thick under the above conditions. After its post curing, the cured product was treated by 20-hour PCT (pressure cooker test) under conditions of 121° C./0.2 MPa to determine the moisture absorption from changes in weight after the treatment.

(6) Continuous Operability:

To evaluate continuous operability, a mold capable of molding-encapsulating 60 semiconductor devices (QFP with 80 pins; external dimensions: 14×20×2.0 mm) in one shot was used to carry out continuous molding for 50 shots at maximum, of the encapsulant composition under the above conditions. The number of shots at which culls stuck to the mold was marked.

(7) Reflow Resistance:

To evaluate reflow resistance, QFP 80-pin resin-encapsulated semiconductor devices (external dimensions: 14×20×2.0 mm) were produced using each encapsulant composition. These were baked at 125° C. for 24 hours, and were moistened in an environment of 85° C./85% RH for predetermined hours (24 to 168 hours), followed by IR solder reflowing at 240° C. for 10 seconds. The number of resin-encapsulated semiconductor devices having caused external cracking was marked to make evaluation by (the number of external-cracked packages)/(the total number of packages examined).

The semiconductor devices for evaluation were produced in the following way. First, as shown in FIG. 1A, a testing IC chip 11 with dimensions of 8×10×0.4 mm was fastened with an adhesive 13 onto a lead frame (42 alloy material; not worked) 12, and the IC chip 11 was wire-bonded at its bonding pads to the lead frame 12 through gold wires 14. Next, using each encapsulant composition, transfer molding was carried out under the above conditions so as to cover the whole chip 11, to form an encapsulating member 15. Thus, an 80-pin flat package shown in FIG. 1B was obtained.

(8) Moisture Resistance:

To evaluate moisture resistance, SOP 28-pin resin-encapsulated semiconductor devices (external dimensions: 18×8.4×2.6 mm) were produced using each encapsulant composition. These were baked at 125° C. for 24 hours, and were moistened in an environment of 85° C./85% RH for 72 hours, followed by IR solder reflowing at 240° C. for 10 seconds, where PCT (121° C., 0.2 MPa) was made for predetermined hours (400 to 2,000 hours) and the number of resin-encapsulated semiconductor devices having caused disconnection by the PCT was marked to make evaluation by (the number of packages having caused disconnection)/(the total number of packages examined).

The semiconductor devices for evaluation were produced in the following way. First, a TEG (test element group) IC chip (Al wiring: 10 and 20 microns wide; gap: 10 and 20 microns; no passivation) with dimensions of 9.6×5.1 mm was fastened with an adhesive onto a lead frame (42 alloy material; dimpled), and the IC chip was wire-bonded at its bonding pads to the lead frame through gold wires. Thereafter, using each encapsulant composition, transfer molding was carried out under the above conditions so as to cover the whole chip, to form an encapsulating member. Thus, the semiconductor devices for evaluation were obtained.

4. Evaluation Results

The results of the above various evaluation are shown in Tables 3 to 6.

TABLE 3

| Evaluation items | Evaluation Results 1 — Example | | | | | |
|---|---|---|---|---|---|---|
| | 1 | 2 | 3 | 4 | 5 | 6 |
| Spiral flow (cm) | 86 | 91 | 97 | 91 | 84 | 71 |
| Hot hardness (Shore D) | 80 | 78 | 82 | 80 | 82 | 82 |
| Al-peel strength (N/m) | 650 | 670 | 660 | 660 | 660 | 660 |
| Extract fluid characteristics (Cl⁻ ppm) | 1.7 | 1.7 | 1.6 | 1.6 | 1.6 | 1.6 |
| Moisture absorption (%) | 0.29 | 0.29 | 0.29 | 0.29 | 0.29 | 0.29 |
| Continuous operability (shots) | 50 | 50 | 50 | 50 | 50 | 50 |
| Reflow resistance | | | | | | |
| 24 h | 0/10 | 0/10 | 0/10 | 0/10 | 0/10 | 0/10 |
| 48 h | 0/10 | 0/10 | 0/10 | 0/10 | 0/10 | 0/10 |
| 96 h | 0/10 | 0/10 | 0/10 | 0/10 | 0/10 | 0/10 |
| 120 h | 0/10 | 0/10 | 0/10 | 0/10 | 0/10 | 0/10 |
| 168 h | 6/10 | 4/10 | 5/10 | 5/10 | 5/10 | 5/10 |
| Moisture resistance | | | | | | |
| 400 h | 0/7 | 0/7 | 0/7 | 0/7 | 0/7 | 0/7 |
| 600 h | 0/7 | 0/7 | 0/7 | 0/7 | 0/7 | 0/7 |
| 800 h | 0/7 | 0/7 | 0/7 | 0/7 | 0/7 | 0/7 |
| 1000 h | 0/7 | 0/7 | 0/7 | 0/7 | 0/7 | 0/7 |
| 1500 h | 0/7 | 0/7 | 0/7 | 0/7 | 0/7 | 0/7 |
| 2000 h | 0/7 | 0/7 | 0/7 | 0/7 | 0/7 | 0/7 |

TABLE 4

| Evaluation items | Evaluation Results 2 — Comparative Example | | | | | | |
|---|---|---|---|---|---|---|---|
| | 1 | 2 | 3 | 4 | 5 | 6 | 7 |
| Spiral flow (cm) | 81 | 81 | 102 | 107 | 18 | 81 | 81 |
| Hot hardness (Shore D) | 78 | 78 | 70 | 65 | 70 | 72 | 72 |
| Al-peel strength (N/m) | 650 | 660 | 660 | 600 | 600 | 620 | 610 |
| Extract fluid characteristics (Cl⁻ ppm) | 4.0 | 2.5 | 1.6 | 1.6 | 1.6 | 1.6 | 4.0 |
| Moisture absorption (%) | 0.29 | 0.29 | 0.42 | 0.40 | 0.23 | 0.29 | 0.29 |
| Continuous operability (shots) | >50 | >50 | >50 | >50 | unloaded | 30 | 30 |
| Reflow resistance | | | | | | | |
| 24 h | 0/10 | 0/10 | 0/10 | 0/10 | faulty molding | 0/10 | 0/10 |
| 48 h | 0/10 | 0/10 | 0/10 | 8/10 | | 0/10 | 0/10 |
| 96 h | 0/10 | 0/10 | 0/10 | 8/10 | | 0/10 | 0/10 |
| 120 h | 0/10 | 0/10 | 0/10 | 10/10 | | 0/10 | 0/10 |
| 168 h | 5/10 | 5/10 | 5/10 | — | | 6/10 | 5/10 |
| Moisture resistance | | | | | | | |
| 400 h | 0/7 | 0/7 | 0/7 | 0/7 | faulty molding | 0/7 | 0/7 |
| 600 h | 0/7 | 0/7 | 0/7 | 0/7 | | 0/7 | 0/7 |
| 800 h | 1/7 | 1/7 | 0/7 | 0/7 | | 0/7 | 1/7 |
| 1000 h | 2/7 | 2/7 | 0/7 | 0/7 | | 0/7 | 3/7 |
| 1500 h | 5/7 | 3/7 | 0/7 | 0/7 | | 0/7 | 5/7 |
| 2000 h | 7/7 | 6/7 | 0/7 | 0/7 | | 0/7 | 7/7 |

TABLE 5

Evaluation Results 3

| Evaluation items | Example 7 | 8 | 9 | 10 | 11 | 12 |
|---|---|---|---|---|---|---|
| Spiral flow (cm) | 86 | 91 | 94 | 91 | 84 | 71 |
| Hot hardness (Shore D) | 79 | 77 | 80 | 79 | 81 | 81 |
| Al-peel strength (N/m) | 650 | 670 | 650 | 660 | 650 | 650 |
| Extract fluid characteristics (Cl⁻ ppm) | 1.7 | 1.7 | 1.6 | 1.6 | 1.6 | 1.6 |
| Moisture absorption (%) | 0.29 | 0.29 | 0.29 | 0.29 | 0.29 | 0.29 |
| Continuous operability (shots) | 50 | 50 | 50 | 50 | 50 | 50 |
| Reflow resistance | | | | | | |
| 24 h | 0/10 | 0/10 | 0/10 | 0/10 | 0/10 | 0/10 |
| 48 h | 0/10 | 0/10 | 0/10 | 0/10 | 0/10 | 0/10 |
| 96 h | 0/10 | 0/10 | 0/10 | 0/10 | 0/10 | 0/10 |
| 120 h | 0/10 | 0/10 | 0/10 | 0/10 | 0/10 | 0/10 |
| 168 h | 7/10 | 5/10 | 6/10 | 6/10 | 6/10 | 5/10 |
| Moisture resistance | | | | | | |
| 400 h | 0/7 | 0/7 | 0/7 | 0/7 | 0/7 | 0/7 |
| 600 h | 0/7 | 0/7 | 0/7 | 0/7 | 0/7 | 0/7 |
| 800 h | 0/7 | 0/7 | 0/7 | 0/7 | 0/7 | 0/7 |
| 1000 h | 0/7 | 0/7 | 0/7 | 0/7 | 0/7 | 0/7 |
| 1500 h | 0/7 | 0/7 | 0/7 | 0/7 | 0/7 | 0/7 |
| 2000 h | 0/7 | 0/7 | 0/7 | 0/7 | 0/7 | 0/7 |

TABLE 6

Evaluation Results 4

| Evaluation items | Comparative Example 8 | 9 | 10 | 11 | 12 | 13 | 14 |
|---|---|---|---|---|---|---|---|
| Spiral flow (cm) | 81 | 81 | 97 | 109 | 20 | 81 | 81 |
| Hot hardness (Shore D) | 77 | 77 | 70 | 65 | 70 | 71 | 71 |
| Al-peel strength (N/m) | 650 | 660 | 660 | 620 | 580 | 620 | 610 |
| Extract fluid characteristics (Cl⁻ ppm) | 4.0 | 2.5 | 1.6 | 1.6 | 1.6 | 1.6 | 4.0 |
| Moisture absorption (%) | 0.29 | 0.29 | 0.42 | 0.40 | 0.23 | 0.29 | 0.29 |
| Continuous operability (shots) | 50 | 50 | 50 | 50 | unloaded | 30 | 30 |
| Reflow resistance | | | | | | | |
| 24 h | 0/10 | 0/10 | 0/10 | 0/10 | faulty molding | 0/10 | 0/10 |
| 48 h | 0/10 | 0/10 | 0/10 | 8/10 | | 0/10 | 0/10 |
| 96 h | 0/10 | 0/10 | 0/10 | 8/10 | | 0/10 | 0/10 |
| 120 h | 0/10 | 0/10 | 0/10 | 10/10 | | 0/10 | 0/10 |
| 168 h | 6/10 | 6/10 | 7/10 | — | | 6/10 | 6/10 |
| Moisture resistance | | | | | | | |
| 400 h | 0/7 | 0/7 | 0/7 | 0/7 | faulty molding | 0/7 | 0/7 |
| 600 h | 0/7 | 0/7 | 0/7 | 0/7 | | 0/7 | 0/7 |
| 800 h | 1/7 | 1/7 | 0/7 | 0/7 | | 0/7 | 1/7 |
| 1000 h | 2/7 | 2/7 | 0/7 | 0/7 | | 0/7 | 3/7 |
| 1500 h | 5/7 | 4/7 | 0/7 | 0/7 | | 0/7 | 4/7 |
| 2000 h | 7/7 | 6/7 | 0/7 | 0/7 | | 0/7 | 7/7 |

As can be seen from the results shown in Tables 3 to 6, since the hydrous bismuth nitrate oxide is mixed as an ion scavenger in an amount of from 2.5 to 20 parts by weight based on 100 parts by weight of the epoxy resin, the impurity chloride ions in the encapsulant composition are captured and hence the moisture resistance is improved. As can also be seen from the results shown in these tables, the adduct of triphenylphosphine with benzoquinone is preferable as a curing accelerator in view of continuous operability.

Comparative Examples 1 and 8, which do not contain any hydrous bismuth nitrate oxide, and Comparative Examples 2 and 9, which contain it but in an amount smaller than the amount specified in the present invention, show an inferior moisture resistance. Comparative Examples 3 and 10, which contain the hydrous bismuth nitrate oxide in an amount larger than the amount specified in the present invention, show inferior results on the hot hardness and moisture absorption.

With regard to the amount of the inorganic filler to be mixed, Comparative Examples 4 and 11, in which it is in an amount less than 70% by volume, show a high moisture absorption and an inferior reflow resistance. In Comparative Examples 5 and 12, in which it is in an amount more than 85% by volume, the encapsulant composition had too low a fluidity to be moldable.

Comparative Examples 6 and 13 and Comparative Examples 7 and 14, which do not use the adduct of triphenylphosphine with benzoquinone as a curing accelerator, show inferior hot hardness and continuous operability. Comparative Examples 7 and 14, which do not further contain the hydrous bismuth nitrate oxide, are inferior also in respect of moisture resistance.

On the other hand, Examples 1 to 12 show good results on the hot hardness and moisture absorption and show superior continuous operability, reflow resistance and moisture resistance. In particular, Examples 1 to 5 and Examples 7 to 11, in which 50% by weight or more of the inorganic filler comprises spherical particles, show high spiral flow and a good fluidity.

What is claimed is:

1. An encapsulant composition comprising an epoxy resin, a curing agent, an inorganic filler, an adduct of triphenylphosphine with benzoquinone, and a hydrous bismuth nitrate oxide;

said inorganic filler being mixed in an amount of from 70% by volume to 85% by volume based on the total weight of the encapsulant composition; and said hydrous bismuth nitrate oxide being mixed in an amount of from 2.5 parts by weight to 20 parts by weight based on 100 parts by weight of the epoxy resin.

2. The encapsulant composition according to claim 1, wherein at least 50% by weight of said inorganic filler comprises spherical particles.

3. The encapsulant composition according to claim 1, wherein said epoxy resin comprises a biphenyl type epoxy resin.

4. The encapsulant composition according to claim 1, wherein said curing agent comprises an aralkyl type phenolic resin.

5. The encapsulant composition according to claim 3, wherein said curing agent comprises an aralkyl type phenolic resin.

6. An electronic device having an encapsulating member comprising a cured product of the encapsulant composition according to claim 1.

* * * * *